United States Patent
Yang et al.

(10) Patent No.: US 10,151,787 B1
(45) Date of Patent: Dec. 11, 2018

(54) AUDIBLE GROUND FAULT BUZZER CIRCUIT

(71) Applicant: Eaton Corporation, Cleveland, OH (US)

(72) Inventors: Lin Yang, Jiangsu (CN); Tao Xiong, Shanghai (CN); Haidong Zhang, Shanghai (CN); Xianzhen Zhang, Shanghai (CN); Shifang Zhang, Shanghai (CN)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 15/866,881

(22) Filed: Jan. 10, 2018

(51) Int. Cl.
    *G08B 3/00*      (2006.01)
    *G01R 31/02*      (2006.01)
    *H02J 9/00*      (2006.01)
    *G08B 21/18*      (2006.01)
    *H03K 7/08*      (2006.01)

(52) U.S. Cl.
CPC .......... *G01R 31/025* (2013.01); *G08B 21/18* (2013.01); *H02J 9/00* (2013.01); *H03K 7/08* (2013.01)

(58) Field of Classification Search
CPC ......... G01R 31/025; H02J 9/00; G08B 21/18; G08B 21/185; G08B 13/22; H03K 7/08; H01H 71/04; H01H 85/30; H01H 85/202; H01H 83/02; H01H 83/20; H02H 3/046; H02H 3/16; H02H 3/167; H02H 9/00; H02H 9/04; B60L 3/0069
USPC ............ 340/388.1, 635, 638, 649, 650, 657; 361/42, 44, 45, 49, 50
See application file for complete search history.

(56) References Cited

U.S. PATENT DOCUMENTS

| | | | | |
|---|---|---|---|---|
| 2007/0164750 | A1* | 7/2007 | Chen | G01R 31/025 324/527 |
| 2012/0323665 | A1* | 12/2012 | Xu | G06Q 20/20 705/14.26 |
| 2015/0309105 | A1* | 10/2015 | Ostrovsky | G01R 31/025 324/509 |
| 2016/0380424 | A1* | 12/2016 | Aromin | H02H 3/162 361/50 |
| 2017/0149235 | A1* | 5/2017 | Cui | H02H 3/338 |
| 2018/0109102 | A1* | 4/2018 | Li | H02H 3/16 |

OTHER PUBLICATIONS

"How to buuild the simplest PWM (Pulse Width Modulated) DC Motor Speed controller using Op Amp", downloaded from YouTude, Sep. 4, 2016.

* cited by examiner

*Primary Examiner* — Anh V La
(74) *Attorney, Agent, or Firm* — Fox Rothschild LLP

(57) ABSTRACT

An audible ground fault detection device may include: a pulse-width modulation (PWM) circuit to produce a pulse signal in response to an occurrence of a ground fault; and a buzzer circuit to emit an audible sound in response to receipt of the pulse signal. The device may include a power circuit configured to transfer power from the power line to the PWM circuit when a ground fault occurs in a load of the power line, and not to transfer the power from the power line to the PWM circuit when no ground fault occurs in any load of the power line. When the PWM circuit has no power, it will not produce the pulse signal. The power circuit may also provide DC power to the buzzer circuit in response to the occurrence of the ground fault. The buzzer circuit may include a passive buzzer.

20 Claims, 2 Drawing Sheets

AUDIBLE GROUND FAULT BUZZER CIRCUIT

BACKGROUND

This disclosure is related to a method and system for ground fault circuit interruption and in particular to producing an audible sound when a ground fault occurs in a circuit.

When a ground fault occurs in a circuit, existing ground fault circuit interrupters (GFCIs) will detect that the current is not flowing in the intended path in the circuit, and subsequently will interrupt the circuit to cut the power to the load. It is desirable to also notify the user of the circuit interruption when such a ground fault occurs. Some devices, such as smart self-test GFCIs made by some manufacturers, produce audible sounds in the event of ground fault. These devices commonly use an active buzzer that includes a built-in oscillator to drive the buzzer. However, an active buzzer is generally prone to high-operating temperatures, and it may be easily damaged due to temperature rise in the circuit associated with ground fault. This patent disclosure addresses the above-described issues and/or other issues.

SUMMARY

An audible ground fault detection circuit may include: a buzzer circuit that includes a buzzer that will emit an audible sound in response to receipt of a pulse signal; a pulse-width modulation (PWM) circuit electrically connected to the buzzer circuit and configured to produce the pulse signal; and a power circuit electrically connected between a power line of a power source and the PWM circuit. The power circuit may be configured to transfer power from the power line to the PWM circuit when a ground fault occurs in a load of the power line so that the PWM circuit will produce the pulse signal. The power circuit may also be configured to not transfer the power from the power line to the PWM circuit when no ground fault occurs in any load of the power line. When the PWM circuit has no power, it will not produce the pulse signal.

The power circuit may include a switch electrically connected between the power line and the power circuit, where the switch has contact points that are configured to close when a ground fault occurs in a load of the power line. This allows transfer of power from the power line to the power circuit to the PWM circuit. The switch is also configured to remain open when there is no ground fault in any load of the power line. This prevents transfer of power from the power line to the power circuit and the PWM circuit.

The power circuit may also include: a first DC power circuit for providing DC power to the PWM circuit; and a rectifier electrically connected between the power line and the first DC power circuit and configured to rectify AC power from the power line to DC power for supplying to an input of the power circuit. In some scenarios, the first DC power circuit may include a resistor and a Zener diode electrically connected in series between the input of the power circuit and ground. The resistor may be positioned to limit current flow into the first DC power circuit, and the Zener diode may be positioned to stabilize output voltage of the first DC power circuit.

The power circuit may further include a second DC power circuit electrically connected between the rectifier and the buzzer circuit for providing DC power to the buzzer circuit. Similar to the first DC power circuit, the second DC power circuit may also include a resistor and a Zener diode that are electrically connected in series between the input of the power circuit and ground. The resistor is configured to limit current flowing into the second DC power circuit, whereas the Zener diode stabilizes output voltage of the second DC power circuit.

In some scenarios, the buzzer circuit may include a transistor having a gate electrically connected to a voltage output of the PWM circuit and a source electrically connected to the buzzer. When the PWM circuit is powered by the first DC power circuit, the voltage output of the PWM circuit will cause current flow through the source of the transistor and the buzzer. Such current flow through the buzzer will cause the buzzer to emit an audible sound.

In some scenarios, the PWM circuit may include: an amplifier having an output connecting to the voltage output; and a rectifier connecting across an input and the output of the amplifier to allow feedback of voltage signals from the output of the amplifier to the input of the amplifier.

In some scenarios, an audible ground fault detection circuit may include: a buzzer circuit, a pulse-width modulation (PWM) circuit and a power circuit. The buzzer circuit may include a passive buzzer that will emit an audible sound in response to receipt of a pulse signal. The PWM circuit is electrically connected to the buzzer circuit and configured to produce the pulse signal. The power circuit is electrically connected to a power line of a power source. When a ground fault occurs in a load of the power line, the power circuit may be configured to transfer power from the power line to the PWM circuit and the buzzer circuit so that the buzzer will emit the audible sound. When no ground fault occurs in any load of the power line, the power circuit may be configured to not transfer power from the power line to the PWM circuit and the buzzer circuit so that the buzzer will not emit the audible sound.

In various embodiments, a method for emitting an audible sound in response to an occurrence of a ground fault can be implemented in the audible ground fault detection circuit illustrated above. The method may include connecting a power circuit between a power line of a power source and a pulse-width modulation (PWM) circuit to: (1) transfer power from the power line to the PWM circuit when a ground fault occurs in a load of the power line; and (2) not transfer the power from the power line to the PWM circuit when no ground fault occurs in any load of the power line. In response to transferring the power from the power line to the PWM circuit, the method may include: using the PWM circuit to produce a pulse signal; and electrically connecting a buzzer circuit to the PWM circuit to receive the pulse signal and emit an audible sound in response to receipt of the pulse signal. In some scenarios, the method may also include providing DC power to the buzzer circuit in response to the occurrence of the ground fault.

BRIEF DESCRIPTION OF THE DRAWINGS

The following figures are shown to better understand the details of the present solution.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

In this document, the term "electrically connected" as used in electrically connecting two components refers to forming a path between the two components so that electrical current may flow through. Two components that are electrically connected may be physically connected by conductors directly, or may be indirectly connected.

Figure 1:
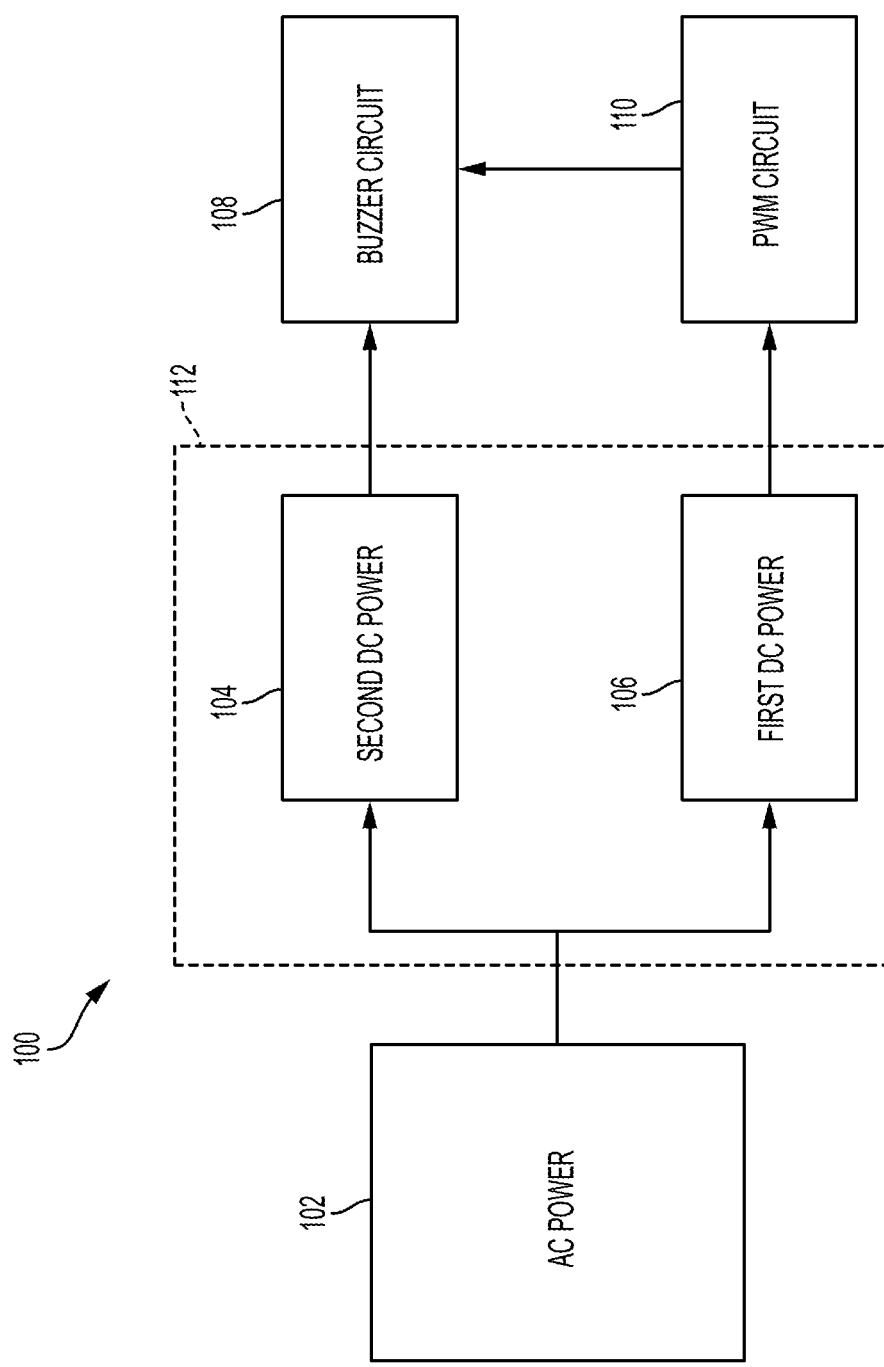
FIG. 1 illustrates an example of an audible ground fault detection circuit.

FIG. 1 illustrates an example of an audible ground fault detection circuit 100, which includes a buzzer circuit 108 that may emit an audible sound in response to receipt of a pulse signal. Circuit 100 also includes: a pulse-width modulation (PWM) circuit electrically connected to the buzzer circuit and configured to produce the pulse signal; and a power circuit 112 electrically connected between a power line of a power source 102 and the PWM circuit 110. In some scenarios, the buzzer may be a passive buzzer. Unlike an active buzzer, which has built-in oscillator for driving the buzzer, a passive buzzer relies on an external circuit that provides changing input signal, such as a pulse signal, to produce the sound. For example, a passive piezo buzzer manufactured by Dongguan Park's Industrial Co., Ltd (China) may be used. Other suitable passive buzzers may also be used.

The PWM circuit 110 is used to generate a pulse signal to drive the passive buzzer, and PWM circuit 110 may be powered by a power circuit 112. Power circuit 112 also may provide power to the buzzer circuit 108. In some scenarios, power circuit 112 may include a first DC power circuit 106 electrically connected to PWM circuit 110 for providing power thereto and a second DC power circuit 104 connected to buzzer circuit 108 for providing power to the buzzer circuit. Power circuit 112 may be powered by a power source 102. In some scenarios, the power source 102 may be AC power. The power line may be a phase line. When a ground fault occurs in a load of the power line, power circuit 112 may be configured to transfer power from the power line to the first DC power 106 and to PWM circuit 110. Power circuit 112 will also transfer power from the power line to the second DC power 104 to the buzzer circuit 108. When both the PWM circuit and the buzzer circuit are powered, the PWM circuit will produce the pulse signal and the buzzer circuit will emit audible sound. When the power line is operating in normal conditions without ground fault in any load, no power will be transferred from the power line to the power circuit. None of the first and second DC powers 106, 104 will operate, and consequently neither PWM circuit 110 nor buzzer circuit 108 will operate to produce audible sound. These and various other components of the audible ground fault detection circuit are further described in detail with reference to FIG. 2.

Figure 2:
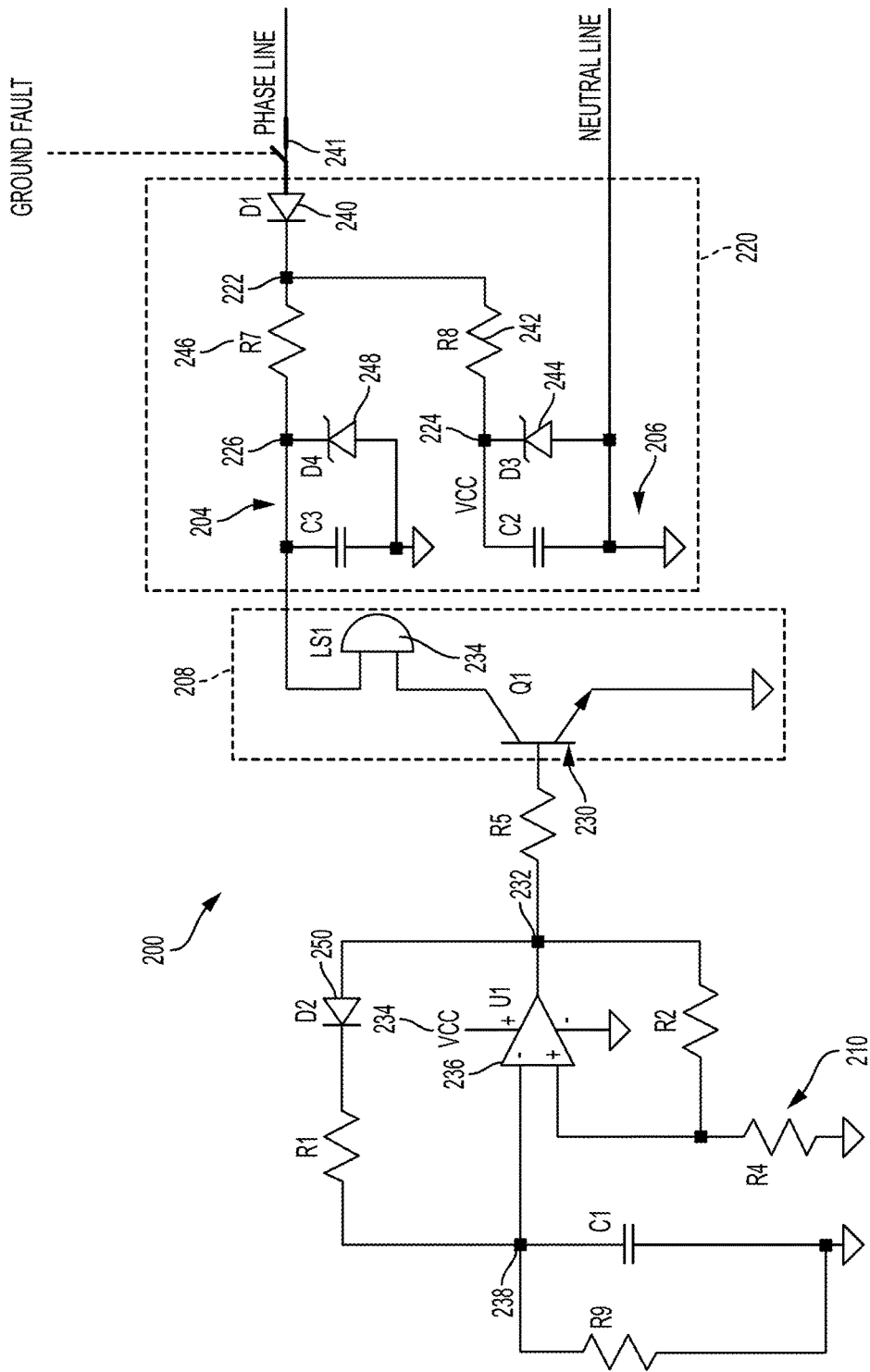
FIG. 2 illustrates details of the audible ground fault detection in the example in FIG. 1.

In FIG. 2, an example of an audible ground fault detection circuit 200 may include a GFCI switch 241 electrically connected between a power line and the power circuit 220. The GFCI switch 241 may have contact points that are configured to close when a ground fault occurs in a load of the power line. This allows transfer of power from the power line (e.g., a phase line) to the power circuit and to the PWM circuit, which is explained further below. The GFCI switch 241 also may be configured to remain open when there is no ground fault in any load of the power line. This prevents transfer of power from the power line to the power circuit so that the power circuit will not operate.

In some scenarios, the power circuit 220 may include a first DC power circuit 206 electrically connected to the PWM circuit 210 for providing DC power to the PWM circuit 210. The power circuit 220 also may include a second DC power circuit 204 electrically connected to the buzzer circuit 208 for providing DC power to the buzzer circuit 208. The first DC power circuit 206 in FIG. 2 corresponds to the first DC power circuit 106 in FIG. 1. The second DC power circuit 204 in FIG. 2 corresponds to the second DC power circuit 104 in FIG. 1. When a ground fault occurs, GFCI switch 241 closes, which allows power to transfer from the power line (e.g., the phase line) to the first and second DC power circuits 206, 204, which will operate to generate DC power for the PWM circuit 210 and buzzer circuit 208, respectively. When the power line is in normal conditions and there is no ground fault, GFCI switch 241 will stay open, and there will be no power to the power circuit 222, nor any power to the first and second DC power circuit 206, 204. As such, the first and second DC power circuit 206, 204 will not operate.

The power circuit 220 also may include a rectifier 240, which is electrically connected between the power line and the first DC power circuit 206. Rectifier 240 rectifies AC power from the power line to DC power for supplying DC power to an input 222 of power circuit 220. In a non-limiting example, rectifier 240 may be a single component, such as a diode. In another example, the rectifier may be a circuit.

In a non-limiting example, the first DC power circuit 206 may include a resistor 242 and a Zener diode 244 that are electrically connected in series between the input 222 of the power circuit 220 and ground. The resistor 242 is configured to limit current flowing into the first DC power circuit 206, whereas the Zener diode 244 is stabilizes output voltage 224 of the first DC power circuit 206. Similar to the first DC power circuit, the second DC power circuit 204 also may include a resistor 246 and a Zener diode 248 that are electrically connected in series between the input 222 of the power circuit 220 and ground. Resistor 246 is positioned to limit current flowing into the second DC power circuit 204, whereas the Zener diode 248 stabilizes output voltage 226 of the second DC power circuit 204. In some scenarios, the first and second DC power circuit 206, 204 may be separate. In other scenarios, the first and second DC power circuit 206, 204 may be integrated in the same circuit.

With further reference to FIG. 2, the buzzer circuit 208 is further described in detail. In some scenarios, buzzer circuit 208 may include a buzzer 228 that is configured to emit audible sound. In a non-limiting example, buzzer 228 may be a passive buzzer, which may be configured to emit the audible sound when driven by a pulse signal. The pulse signal may be produced by the PWM circuit 210 that outputs the pulse signal, e.g., an output voltage, at 232. The voltage 224 output by the first DC power circuit 206 may serve as a power input of the PWM circuit 234. When the PWM circuit 210 is powered, it will produce voltage output 232.

In some scenarios, the buzzer circuit 208 may further include a transistor 230 having the gate electrically connected to the voltage output 232 of the PWM circuit 210 and having its source or drain electrically connected to the buzzer 228. The voltage output 232 of the PWM circuit may be a low frequency pulse voltage, which will cause transistor 230 to turn on and off at such low frequency. When transistor 230 is turned on, current will flow between the source and the drain, and through buzzer 228. Such current flow through the buzzer will cause the buzzer to emit the audible sound. In some scenarios, the low frequency pulse-width voltage generated by the PWM may have a frequency around 5 KHz. Alternatively, the PWM circuit may also generate pulse signals in a higher frequency range, which may cause the buzzer to emit audible sound at higher frequency.

In some scenarios, the PWM circuit 210 may include: an amplifier 236 having an output connecting to the voltage output 232. Amplifier 236 may be an operational amplifier (op-amp), such as a low power op-amp. The PWM circuit 210 may also have a rectifier 250 that connects across an input 238 and output 232 of amplifier 236. The rectifier allows a feedback of voltage signals from the output of the amplifier to the input of the amplifier. Rectifier 250 may be a single component, such as a diode; or it may be a circuit. Such configuration of the PWM circuit 210 may be able to operate with lower power than that required of a timer integrated circuit (IC)-based solution.

The above illustrated embodiments provide advantages over existing systems. For example, a GFCI switch is positioned to close, to provide power from the AC power source to a buzzer circuit and to a PWM circuit for driving the buzzer to emit audible sound, only when there is ground fault. The illustrated apparatus also uses a passive buzzer and a PWM driving circuit to reduce the risk of damaging the apparatus due to high temperature associated with using an active buzzer. Further, the PWM circuit operates in low power that is lower than that required by a timer IC. Other advantages can be evident from the above descriptions.

The features and functions described above, as well as alternatives, may be combined into many other different systems or applications as appreciated by one ordinarily skilled in the art. For example, the audible ground fault detection circuit may include a buzzer circuit that has a passive buzzer, a PWM circuit and a power circuit that is configured to, when a ground fault occurs in a load, simultaneously provide power to the PWM circuit and the buzzer circuit by transferring power from a power line to the PWM circuit and the buzzer circuit so that the buzzer of the buzzer circuit will emit the audible sound. When there is no ground fault in any load of the power line, the power circuit may be configured to not transfer power from the power line to the PWM circuit and the buzzer circuit so that the buzzer will not emit the audible sound. Various alternatives, modifications, variations or improvements may be made by those skilled in the art, each of which is also intended to be encompassed by the disclosed embodiments.

The invention claimed is:

1. An audible ground fault detection circuit, comprising:
   a buzzer circuit comprising a buzzer that will emit an audible sound in response to receipt of a pulse signal;
   a pulse-width modulation (PWM) circuit electrically connected to the buzzer circuit and configured to produce the pulse signal; and
   a power circuit electrically connected between a power line of a power source and the PWM circuit, and configured to:
      transfer power from the power line to the PWM circuit when a ground fault occurs in a load of the power line so that the PWM circuit will produce the pulse signal, and
      not transfer power from the power line to the PWM circuit when no ground fault occurs in any load of the power line so that the PWM circuit will not produce the pulse signal.

2. The circuit of claim 1, further comprising a ground fault circuit interrupter (GFCI) switch electrically connected between the power line and the power circuit, wherein the GFCI switch has contact points that are configured to remain open when there is no ground fault in any load of the power line and close when a ground fault occurs in a load of the power line.

3. The circuit of claim 2, wherein the power circuit comprises:
   a first DC power circuit electrically connected to the PWM circuit for providing DC power to the PWM circuit; and
   a rectifier electrically connected between the GFCI switch and the first DC power circuit and configured to rectify AC power from the power line to DC power for supplying to an input of the power circuit.

4. The circuit of claim 3, wherein the first DC power circuit comprises a resistor and a Zener diode that are electrically connected in series between the input of the power circuit and ground, wherein:
   the resistor limits current flowing into the first DC power circuit; and
   the Zener diode stabilizes output voltage of the first DC power circuit.

5. The circuit of claim 3, wherein the power circuit further comprises:
   a second DC power circuit electrically connected between the rectifier and the buzzer circuit for providing DC power to the buzzer circuit, the second DC power circuit comprising a resistor and a Zener diode electrically connected in series, wherein:
      the resistor limits current flowing into the second DC power circuit; and
      the Zener diode stabilizes output voltage of the second DC power circuit.

6. The circuit of claim 5, wherein the buzzer is a passive buzzer.

7. The circuit of claim 1, wherein the power line is a phase line.

8. The circuit of claim 3, wherein the buzzer circuit further comprises a transistor having a gate electrically connected to a voltage output of the PWM circuit and a source electrically connected to the buzzer so that, when the PWM circuit is powered by the first DC power circuit, the voltage output of the PWM circuit will cause current flow through the source of the transistor and the buzzer and also cause the buzzer to emit the audible sound.

9. The circuit of claim 1, wherein the PWM circuit comprises:
   an amplifier having an output connecting to a voltage output of the PWM circuit; and
   a rectifier connecting across an input and the output of the amplifier to allow a feedback of voltage signals from the output of the amplifier to the input of the amplifier.

10. A method for emitting an audible sound in response to an occurrence of a ground fault, comprising:
   by a power circuit connected between a power line of a power source and a pulse-width modulation (PWM) circuit:
      transferring power from the power line to the PWM circuit when a ground fault occurs in a load of the power line, and
      not transferring power from the power line to the PWM circuit when no ground fault occurs in any load of the power line; and
   in response to transferring the power from the power line to the PWM circuit:
      producing, by the PWM circuit, a pulse signal, and
      emitting, by a buzzer circuit electrically connected to the PWM circuit, an audible sound in response to receipt of the pulse signal.

11. The method of claim 10, wherein transferring power from the power line to the PWM circuit comprises using a ground fault circuit interrupter (GFCI) switch electrically connected between the power line and the power circuit so that:
   contact points of the GFCI switch remain open when there is no ground fault in any load of the power line; and
   contact points of the GFCI switch remain close when a ground fault occurs in a load of the power line.

12. The method of claim 11, wherein transferring power from the power line to the PWM circuit comprises:
   rectifying, by a rectifier electrically connected between the GFCI switch and a first DC power circuit electrically connected to the PWM circuit, AC power from the power line to DC power for supplying to an input of the power circuit; and
   providing, by the first DC power circuit, DC power to the PWM circuit.

13. The method of claim 12, wherein providing the DC power to the PWM circuit comprises:
   using a resistor of the first DC power circuit to limit current flowing into the first DC power circuit; and
   using a Zener diode of the first DC power circuit to stabilize output voltage of the first DC power circuit.

14. The method of claim 12, further comprising:
   providing, by a second DC power circuit, DC power to the buzzer circuit by:
      using a resistor of the second DC power circuit to limit current flowing into the second DC power circuit; and
      using a Zener diode of the second DC power circuit to stabilize output voltage of the second DC power circuit.

15. The method of claim 14, wherein the buzzer circuit comprises a passive buzzer.

16. The method of claim 10, wherein the power line is a phase line.

17. The method of claim 12, wherein emitting the audible sound in response to receipt of the pulse signal comprises using a transistor to cause current flow through a buzzer of the buzzer circuit when the PWM circuit is powered by the first DC power circuit, wherein:
   a source of the transistor is connected to the buzzer of the buzzer circuit; and
   a gate of the transistor is connected to a voltage output of the PWM circuit.

18. The method of claim 10, wherein producing the pulse signal comprises:
   using an amplifier to produce a voltage output of the PWM circuit; and
   using a rectifier connecting across an input and output of the amplifier to allow a feedback of voltage signals from the output of the amplifier to the input of the amplifier.

19. An audible ground fault detection circuit, comprising:
   a buzzer circuit comprising a passive buzzer that will emit an audible sound in response to receipt of a pulse signal;
   a pulse-width modulation (PWM) circuit electrically connected to the buzzer circuit and configured to produce the pulse signal; and
   a power circuit electrically connected to a power line of a power source and configured to:
      when a ground fault occurs in a load of the power line, transfer power from the power line to the PWM circuit and the buzzer circuit so that the passive buzzer will emit the audible sound, and
      when no ground fault occurs in any load of the power line, not transfer power from the power line to the PWM circuit and the buzzer circuit so that the passive buzzer will not emit the audible sound.

20. The circuit of claim 19, wherein the buzzer circuit further comprises a transistor having a gate electrically connected to a voltage output of the PWM circuit and a source electrically connected to the passive buzzer so that, when the PWM circuit is powered by the power circuit, the voltage output of the PWM circuit will cause current flow through the source of the transistor and the passive buzzer and also cause the passive buzzer to emit the audible sound.

* * * * *